(12) United States Patent
Novotny

(10) Patent No.: US 6,896,612 B1
(45) Date of Patent: May 24, 2005

(54) SELF-COOLED ELECTRONIC EQUIPMENT ENCLOSURE WITH FAILURE TOLERANT COOLING SYSTEM AND METHOD OF OPERATION

(75) Inventor: Shlomo D. Novotny, Wayland, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/764,848

(22) Filed: Jan. 26, 2004

(51) Int. Cl.$^7$ .............................................. H05K 7/20
(52) U.S. Cl. ....................... 454/184; 361/691; 361/696
(58) Field of Search ................................ 454/184, 186, 454/187; 361/691, 696

(56) References Cited

U.S. PATENT DOCUMENTS

| | | | | |
|---|---|---|---|---|
| 2,012,527 A | * | 8/1935 | Batchelder, Jr. ............. | 454/75 |
| 2,675,228 A | * | 4/1954 | Baird et al. ..................... | 49/21 |
| 4,665,466 A | * | 5/1987 | Green ......................... | 361/696 |
| 6,538,881 B1 | * | 3/2003 | Jeakins et al. .............. | 361/687 |

OTHER PUBLICATIONS

"Protection for Today's Needs . . . And Tomorrow's Opportunities", Liebert Foundation, http://www.liebert.com/whatsnew/foundation/foundation.asp.

* cited by examiner

Primary Examiner—Harold Joyce
(74) Attorney, Agent, or Firm—Kudirka & Jobse, LLP

(57) ABSTRACT

A sealed electronic equipment enclosure with a dedicated cooling system is fitted with movable louvers in the enclosure walls. During normal operation, air pressure developed by the dedicated cooling system keeps the louvers closed and maintains the enclosure sealed to the computer room environment. If the dedicated cooling system fails, the internal air pressure developed by the cooling system is reduced and air movers in the electronic equipment force the louvers open, thereby allowing the air movers to draw cooled air from the computer room into the enclosure. This cooled air prevents the equipment from overheating at least for a time period long enough to allow the dedicated cooling system to be replaced or repaired.

25 Claims, 6 Drawing Sheets

SELF-COOLED ELECTRONIC EQUIPMENT ENCLOSURE WITH FAILURE TOLERANT COOLING SYSTEM AND METHOD OF OPERATION

FIELD OF THE INVENTION

This invention relates to self-cooled electronic equipment enclosures with internal cooling systems and to mechanisms for avoiding equipment shutdown on cooling system failure.

BACKGROUND OF THE INVENTION

In many large electronic equipment centers or data centers it is common practice to mount electronic equipment in enclosures called "racks." In order to cool the equipment, the racks have open fronts and backs and are placed in an air-conditioned computer room. The interior of a typical computer room 100 is illustrated in FIG. 1. In such a room, a raised floor 103 is constructed over the actual floor 102. The raised floor is conventionally constructed of a grid framework 104 that supports modular floor panels 106. The racks of equipment, of which racks 116, 118, 120, 122 and 124 are shown, are placed on the raised floor 103. Typically, channels 130 and 132 run across the tops of the racks to allow the electronic equipment to be interconnected by cables. (not shown) that are placed in the channels.

At the perimeter of the room 100, one or more computer room air-conditioning (CRAC) units, of which unit 108 is shown, provide cooling. Unit 108 generates a stream of refrigerated air illustrated schematically by arrow 110 in the space between the raised floor 103 and the actual floor 102. The cooled air enters the room though perforations 112 in the panels located between the racks 116 and 124 and 120 and 122. The electronic equipment in the racks typically has air movers comprised of blowers or fans that circulate air over the equipment. Thus, the cooled air is drawn into the equipment as schematically illustrated by arrow 114.

The heated air is exhausted from the back of the racks and rises to the ceiling of the room 100 as schematically illustrated by arrows 140, 142 and 144. Warm air at the ceiling is then drawn into the intake 160 of the CRAC unit 108 as indicated schematically by arrows 150, 152 and 154 in order to begin the cycle again.

While this arrangement operates in a satisfactory manner, computer room personnel must take care to physically locate the equipment racks in the room in order to evenly spread the cooling load represented by the electronic equipment. Otherwise localized "hot spots" can develop and cause equipment overheating even though the CRAC units can handle the overall cooling load. In a large data center where equipment is constantly being added, removed and changed, the logistics of maintaining an even cooling load can become difficult. Further, conventional computer room cooling systems have been designed to handle power dissipations of 1–1.5 kilowatts per rack. However, the reduction in electronic component size has resulted in electronic systems currently being built that dissipate 12–20 kilowatts per rack. Even with proper equipment placement, such systems can cause a hot spot and a cooling overload. If an electronic system overheats, it can become damaged. Alternatively, on-board sensors may power down the system, resulting in an unscheduled service interruption.

One prior art attempt to solve the hot spot problem is to mount a dedicated cooling system on the top of a rack. This dedicated cooling system can be a self-contained air conditioning unit or it can be a heat exchanger that receives a cooling liquid, such as chilled water, via pipes from a cooling system located at the perimeter of the room. The dedicated cooling system draws in hot air rising from the back of the rack, cools the air and generates a stream of cooled air that is discharged in front of the rack where it can be drawn into the rack by the air movers that are part of the electronic equipment. A problem with this system is that there is little control over the cooled air since the racks are open.1

Another alternative is to enclose the electronic equipment in a sealed enclosure that is provided with its own dedicated cooling system. This cooling system can also be a self-contained air conditioning unit or a heat exchanger that receives a cooling liquid from a cooling system located at the perimeter of the room. A sealed enclosure has the advantage that it is completely independent from any of the other racks in its vicinity. Consequently, such sealed units can be placed anywhere in the computer room without developing hot spot problems. This greatly simplifies the logistics of maintaining the computer room. However, if the cooling system fails, the electronic equipment in the sealed enclosure will rapidly overheat and shut down. One prior art method of solving this latter problem is to include a backup cooling system in the enclosure that can prevent the equipment from overheating at least for a time period long enough to allow the cooling system to be replaced or repaired. Unfortunately, backup cooling systems add significantly to the cost of the enclosure, rendering their use prohibitive in many applications.

SUMMARY OF THE INVENTION

In accordance with the principles of the invention, a sealed enclosure with a dedicated cooling system is fitted with movable louvers in the enclosure walls. During normal operation, air pressure developed by the dedicated cooling system keeps the louvers closed and maintains the enclosure sealed to the computer room environment. If the dedicated cooling system fails, the internal air pressure developed by the cooling system is reduced and air movers in the electronic equipment force the louvers open, thereby allowing the air movers to draw cooled air from the computer room into the enclosure. This cooled air prevents the equipment from overheating at least for a time period long enough to allow the dedicated cooling system to be replaced or repaired.

In accordance with one embodiment, movable louvers are placed in doors at opposite sides of the enclosure.

In accordance with another embodiment, the louvers pivot on pins and are closed by gravity.

In accordance with yet another embodiment, the louvers are attached to the housing by spring hinges.

BRIEF DESCRIPTION OF THE DRAWINGS

The above and further advantages of the invention may be better understood by referring to the following description in conjunction with the accompanying drawings in which.

DETAILED DESCRIPTION

Figure 1:
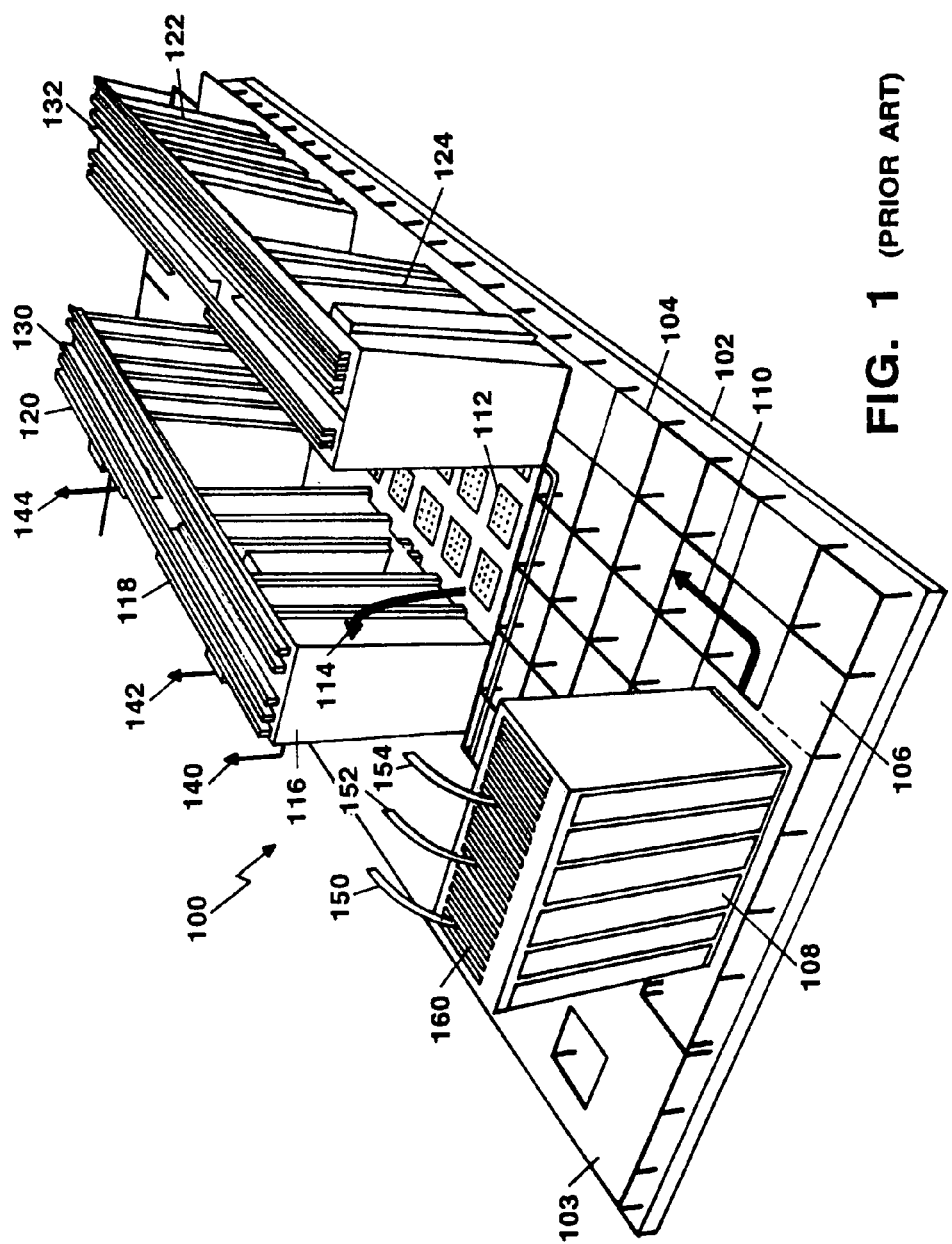
FIG. 1 is a perspective view of a conventional computer room schematically illustrating the flow of cooled air produced by a perimeter air conditioning system.
Figure 2:
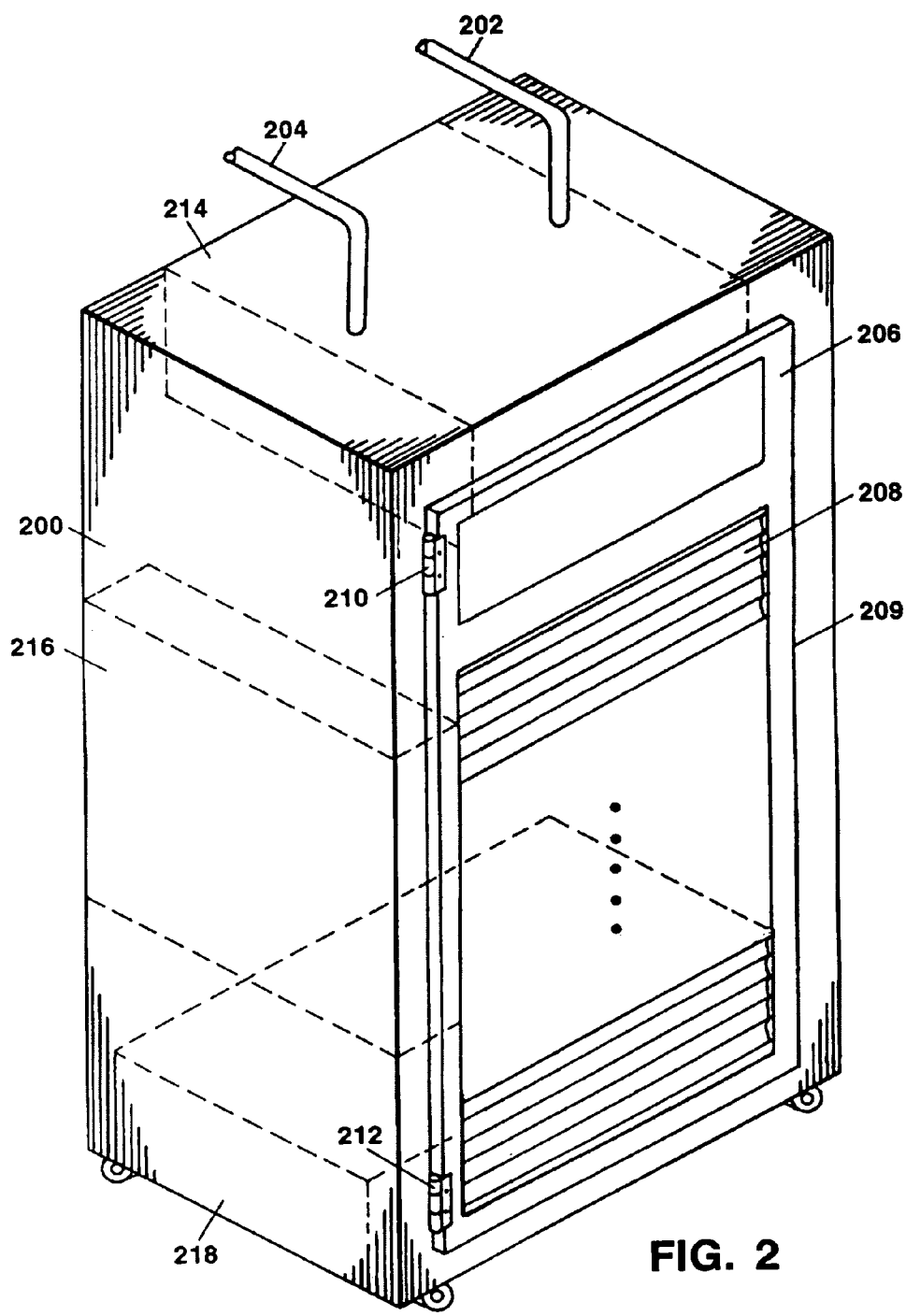
FIG. 2 is a perspective view of an electronic equipment enclosure including horizontal air flow controlled louvers in accordance with the principles of the invention.

FIG. 2 is a perspective view of an electronic equipment enclosure 200 including air flow controlled louvers in accordance with the principles of the invention. As shown in FIG. 2, the enclosure 200 may be connected to an external cooling unit that provides a coolant via pipes 202 and 204. Pipes 202 and 204 connect to a heat exchanger.214 located within the enclosure 200. Alternatively, the heat exchanger (or cooling unit) may be located at either the side of enclosure 200 as shown schematically at 216 or on both sides. The heat exchanger (or cooling unit) may also be located at the bottom of enclosure 200 as shown schematically at 218. Alternatively, a self-contained dedicated cooling unit may be used within enclosure 200 in which case pipes 202 and 204 are unnecessary. In all cases the inventive air flow controlled louvers work in the same manner.

Enclosure 200 is fitted with hinged doors, of which door 206 is shown. Door 206 is attached to enclosure 200 by means of hinges 210 and 212 in order to allow access to the interior of enclosure for equipment repair or replacement. Preferably door 206 is fitted with air tight seals (not shown) to maintain the enclosure sealed when the door is closed. In accordance with the principles of the invention, door 206 contains a set of louvers 208 located within a recess 209 in the door 206. As will be hereinafter explained, these louvers are controlled by air pressure in order to provide an alternate air path if the cooling system 214 fails. These louvers may be either gravity or spring operated as discussed below.

Another door (not shown in FIG. 2) is located on the opposite side of enclosure 200 to allow access to the rear side of the equipment in enclosure 200. This other door may be similar to door 206 or may be different. For example, it may be a different size or may be fitted with a different hinge arrangement. In any case this other door is also fitted with louvers in the same manner as door 206. Alternatively, the hinged doors could be replaced with removable panels in which the louvers are mounted without departing from the spirit and scope of the invention.

Figure 3:
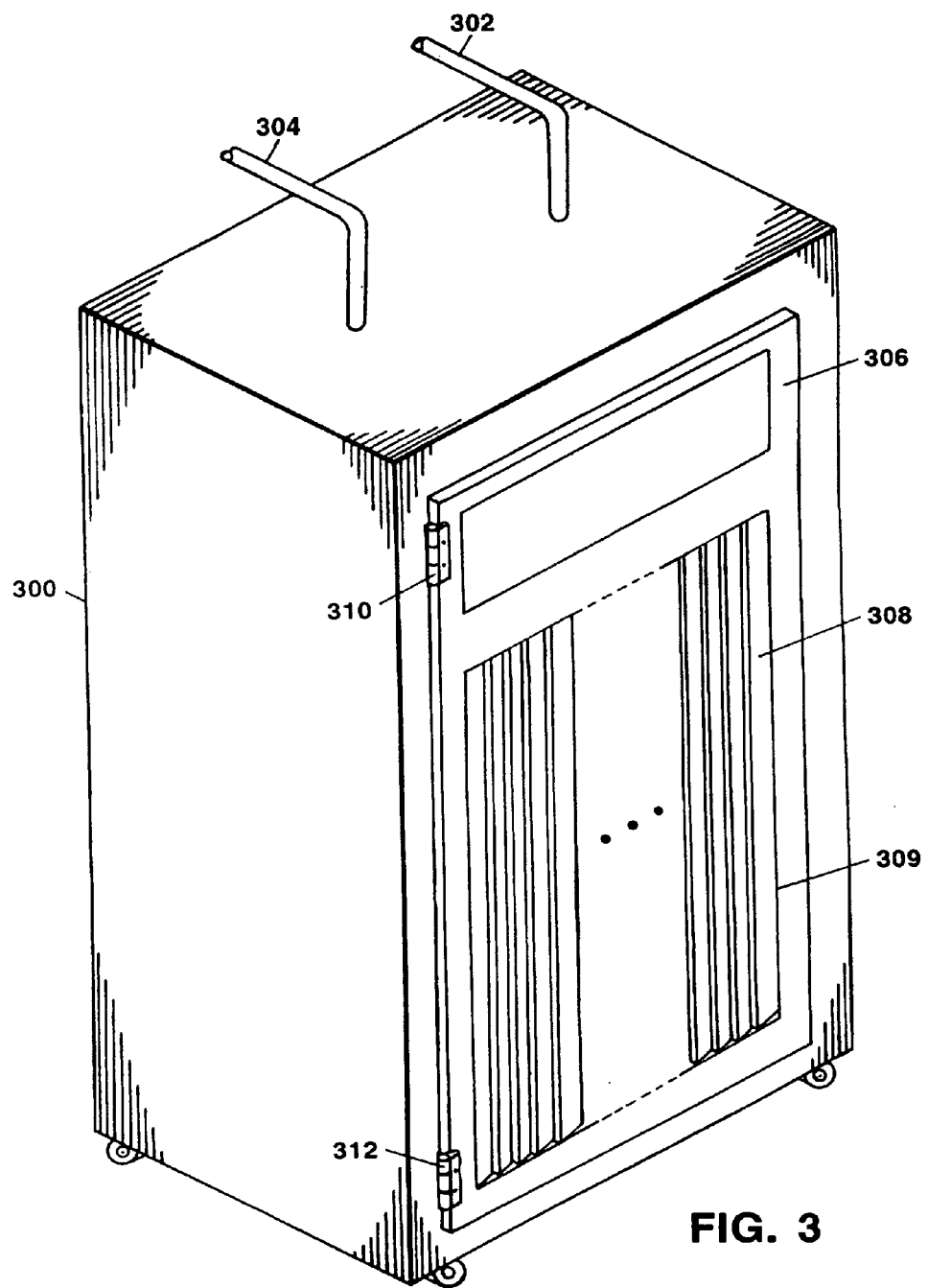
FIG. 3 is a perspective view of an electronic equipment enclosure including vertical air flow controlled louvers in accordance with the principles of the invention.

The louvers 208 can also be mounted vertically as shown in FIG. 3. In FIG. 3, elements that correspond to elements in FIG. 2 have been given corresponding numeral designations. For example, enclosure 300 in FIG. 3 corresponds to enclosure 200 in FIG. 2. Similarly, louvers 308 in FIG. 3 correspond to louvers 208 in FIG. 2. A door similar to door 306 is also located at the opposite side of enclosure 300 in a manner similar to the enclosure 200 in FIG. 2.

Figure 4:
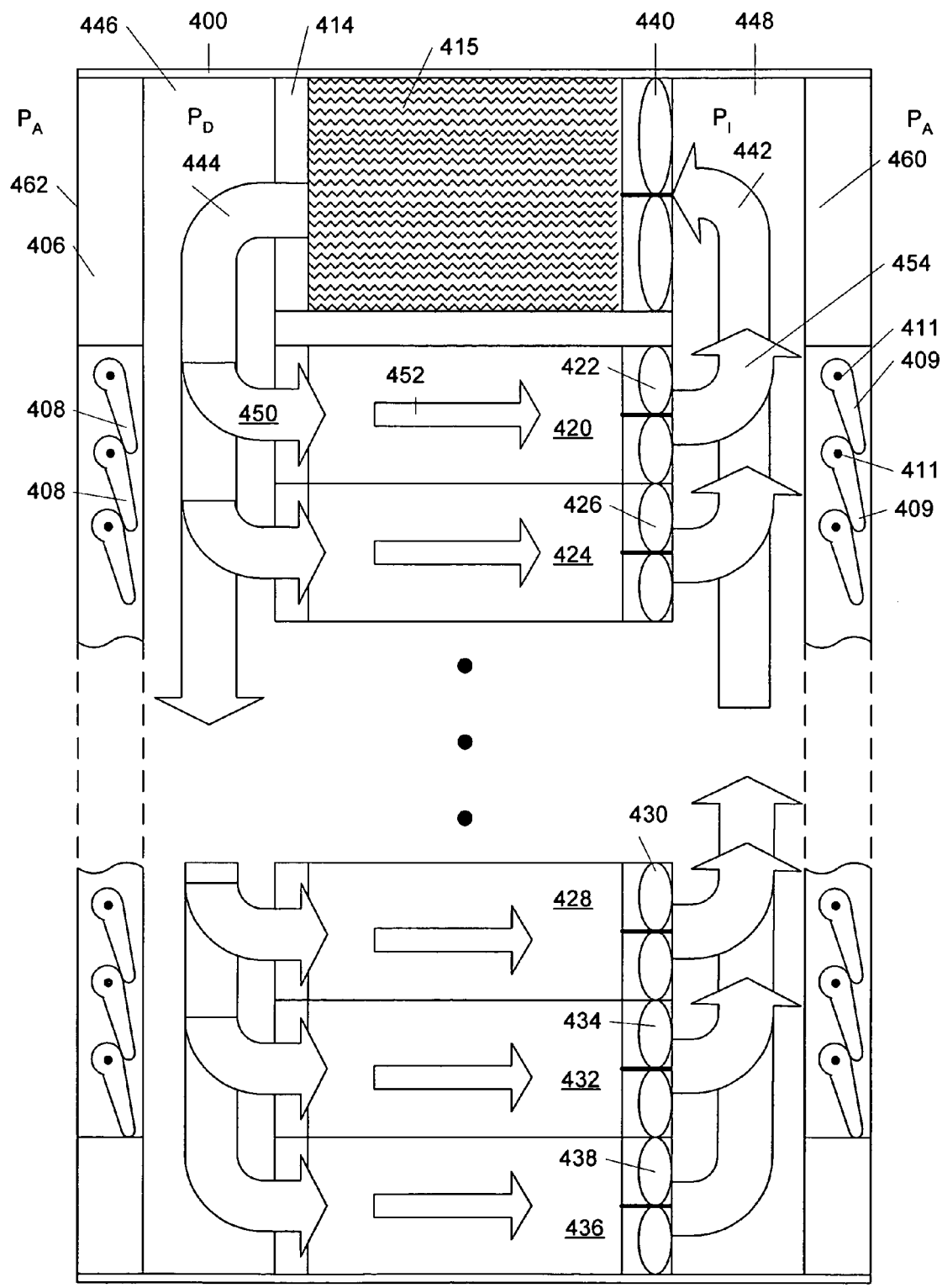
FIG. 4 is a side view of an electronic equipment enclosure wherein the side panel has been cut away to illustrate the air flow within the enclosure when the dedicated cooling unit is in operation.

FIG. 4 is a side view of an enclosure 400 constructed in accordance with the principles of the invention. The side wall of the enclosure has been cut away so that the air flow patterns can be illustrated. Typically, enclosure 400 contains a plurality of equipment trays that are mounted in the center of the enclosure. In FIG. 4, trays 420, 424, 428, 432 and 436 are shown. Trays 420–436 have sufficient width that they extend across the entire width of enclosure 400. However, trays 420–436 do not extend the full depth of the enclosure and leave air circulation spaces 446 and 448 at the front and back of the enclosure, respectively.

The cooling unit 414 is located at the top of the enclosure 400 in this embodiment. Unit 414 typically has a heat exchanger element 415 that cools air passing over the element. Since the heat exchanger element 415 is comprised of fins or other extensions that increase its surface area, it has a high airflow resistance. A powerful fan or blower, schematically illustrated as fan 440, is used to overcome the airflow resistance of the heat exchanger element and provide air circulation. In particular, heated air is drawn into the heat exchanger element 415 as indicated by arrow 442 and cooled air is discharged as indicated by arrow 444.

In general, the electronic equipment in each tray is also provided with an air mover, in the form of a fan or blower that draws cooled air over the electronics. These air movers are schematically illustrated as fans 422, 426, 430, 434 and 438 for trays 420, 424, 428, 432 and 436, respectively. The air mover 422 for a tray, such as tray 420, draws in some of the cooled air discharged by the heat exchanger element 415 as indicated, for example by arrow 450, passes the air over the electronics as indicated by arrow 452 and discharges heated air into the rear air circulation space 448 as indicated by arrow 454. A similar airflow occurs in each tray under the action of the associated air mover. The heated air discharged by all air movers into space 448 is then drawn into the heat exchanger element by fan 440.

Because fan 440 has a much larger capacity than the individual air movers 422–438, even with all air movers operating, the pressure $P_I$ in the heat exchanger intake space 448 will be lower than the ambient pressure $P_A$ outside of the enclosure 400. Similarly the pressure $P_D$ in the heat exchanger discharge space 446 will be higher than the ambient pressure $P_A$ outside of the enclosure 400.

The pressure differential in the intake space 448 is applied across the back wall 460 of the enclosure 400 in which louvers 409 are located. In FIG. 4, louvers 409 are illustrated as pivoting about pins 411, although other arrangements, discussed below, can also be used. Louvers 409 are biased so that they are normally closed as illustrated in FIG. 4. Biasing can be accomplished by gravity or springs. When the louvers are in their closed position as shown in FIG. 4, the pressure differential between the air outside the enclosure and the lower pressure of the intake space 448 maintains the louvers in the closed position, thereby sealing the intake space from the ambient air.

Similarly, the pressure differential of the higher pressure in the discharge space 448 over the ambient air pressure is applied across the front wall 462 of the enclosure 400 in which louvers 408 are located. As with louvers 409, louvers 408 are illustrated as pivoting about pins 413. Louvers 408 are also biased so that they are normally closed as illustrated in FIG. 4. When the louvers 408 are in their closed position as shown in FIG. 4, the pressure differential between the discharge space 446 and the air outside the enclosure maintains the louvers in the closed position, thereby sealing the discharge space from the ambient air. Consequently, during normal operation, the front and back walls of the enclosure 400 are sealed by the louvers causing the enclosure to act as a totally sealed enclosure independent of the outside environment.

Figure 5:
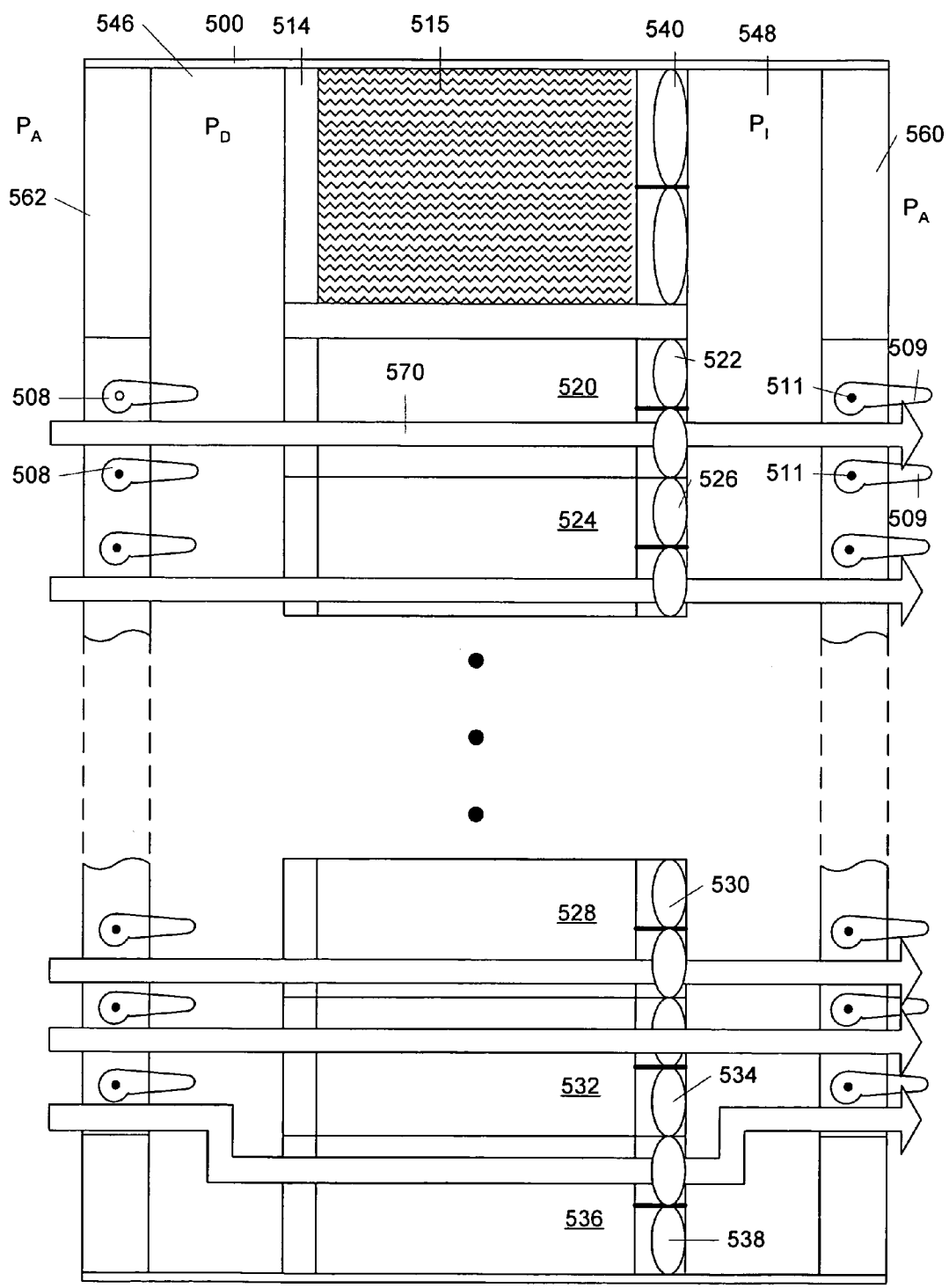
FIG. 5 is a side view of an electronic equipment enclosure wherein the side panel has been cut away to illustrate the air flow within the enclosure when the dedicated air cooling unit is not in operation.

FIG. 5 illustrates the operation of the enclosure during a failure of the dedicated cooling system in accordance with the principles of the invention. In FIG. 5, elements that correspond to elements in FIG. 4 have been given corresponding numeral designations. For example, heat exchange element 415 corresponds to heat exchanger element 515. Elements in FIG. 5 that correspond to elements in FIG. 4 will not be described in general. Cooling system failure can occur because the fan 440 fails or because the source of cooling liquid fails or for some other reason. The cooling system is arranged so that fan 440 stops operating regardless of the source of failure. This can be accomplished, for example, by mounting on the heat exchanger element 515, a temperature detector 541 that removes power from the fan when the temperature of the heat exchanger element 515 rises above a predetermined threshold.

Therefore, upon failure of the cooling system, the fan 540 will stop operating. However, the air movers 522–538 in the electronic equipment trays continue to operate. Since the air flow resistance of heat exchange element 515 is considerable, the output air flow of the air movers 522–538 quickly reverses the pressure differential between the intake space 448 and the outside air so that the pressure $P_I$ becomes higher than the ambient air pressure $P_A$. This new pressure differential is applied to the louvers 409 causing them to swing out as shown in FIG. 5.

Similarly, due to the air flow resistance of the heat exchanger element 515, the intake air flow of the air movers 522–538 quickly reverses the pressure differential between the discharge space 446 and the outside air so that the pressure $P_D$ becomes lower than the ambient air pressure $P_A$. This new pressure differential is applied to the louvers 408 causing them to swing in as shown in FIG. 5.

The opening of louvers 408 and 409 establishes a new air flow path 570 in which the air mover 522 draws cooled air from computer room in through the front of the enclosure 500 and exhausts heated air into the computer room the back of the enclosure 500. Since the air in the computer room is generally cooled by the conventional CRAC systems, it will provide sufficient cooling for the electronic units until a controlled shut down can be effected or the cooling unit can be repaired by computer room personnel. Similar air paths result from the continued operation of air movers 526–538.

Figure 6:
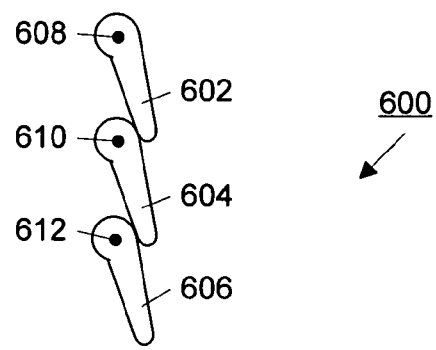
FIG. 6 is a detailed end view of a set of louvers that pivot on pins.
Figure 7:
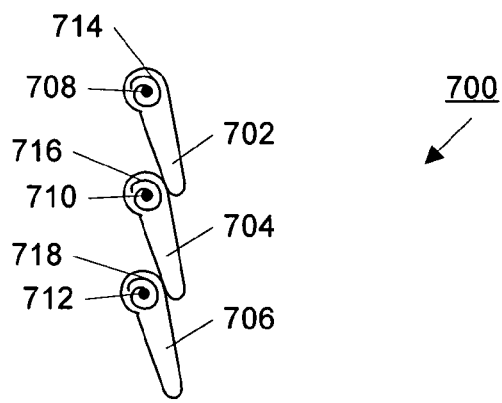
FIG. 7 is a detailed end view of a set of louvers that are biased by springs.
Figure 8:
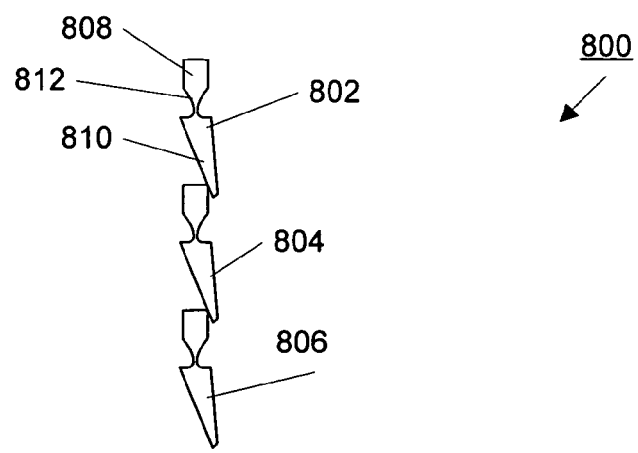
FIG. 8 is a detailed end view of a set of louvers with spring-loaded hinges.

The louvers can be of several types as shown in FIGS. 6, 7 and 8. FIG. 6 shows the louvers 600 as illustrated in FIGS. 4 and 5. FIG. 6 illustrates one end of each louver, of which louvers 602, 604 and 606 are shown. Louvers 602, 604 and 606 are pivoted on pin pairs consisting of a pin located at each end of a louver of which pins 608, 610 and 612 are illustrated. Another pin (not shown in FIG. 6) would be located in the opposing end of each louver. Louvers 602, 604 and 606 are biased in the closed position via gravity.

FIG. 7 shows the louvers 700 similar to those illustrated in FIGS. 4 and 5. FIG. 7 also illustrates one end of each louver, of which louvers 702, 704 and 706 are shown. Louvers 702, 704 and 706 are pivoted on pin pairs consisting of a pin located at each end of a louver of which pins 708, 710 and 712 are illustrated. Another pin (not shown in FIG. 7) would be located in the opposing end of the louvers. Louvers 702, 704 and 706 are biased in the closed position by means of springs 714, 716 and 718, which could be coil springs as shown or flat springs. Spring-loaded louvers, such as louvers 702, 704 and 706, are suitable for enclosures such as that shown in FIG. 3, in which the louvers are vertical.

FIG. 8 illustrates louvers 800 that have spring hinges. Three louvers 802, 804 and 806 are shown. Each louver, such as louver 802, comprises a support piece 808 that is attached to the enclosure. The support piece 808 is, in turn, attached, by a spring hinge 812 to the louver 810. The support piece 808, the spring hinge 812 and the louver 810 may be formed of the same piece of material that has been molded into the appropriate shape. Advantageously, the louvers 802, 804 and 806 could by fabricated from a plastic polymeric material.

It is also possible for the louvers to be motor driven. In this case the motor can be controlled by a sensor that causes the motor to open the louvers when the pressure differentials between the intake and discharge spaces reverse due to cooling system failure.

Although an exemplary embodiment of the invention has been disclosed, it will be apparent to those skilled in the art that various changes and modifications can be made which will achieve some of the advantages of the invention without departing from the spirit and scope of the invention. For example, it will be obvious to those reasonably skilled in the art that, although the problem stated above was described in terms of a conventional rack enclosure, other enclosures could also be similarly fitted with louvers and realize the advantages and benefits of the inventions. Similarly, other arrangements, such as flaps or doors can be substituted for the louvers in order to achieve the same effect. Other aspects such as the specific size and configuration of the louvers and/or closing mechanisms utilized to achieve a particular function, as well as other modifications to the inventive concept are intended to be covered by the appended claims.

What is claimed is:

1. An equipment enclosure that establishes an enclosed environment separated from an ambient environment and has a cooling system that draws air from an intake space in the enclosed environment and discharges air into a discharge space in the enclosed environment, the enclosure comprising:
   a first louver that responds to a pressure differential between the intake space and the ambient environment to connect the intake space to the ambient environment when the cooling systems fails; and
   a second louver that responds to a pressure differential between the discharge space and the ambient environment to connect the discharge space to the ambient environment when the cooling system fails.

2. The equipment enclosure of claim 1 wherein the enclosure contains electronic equipment with air movers that generate an air flow from the discharge space into the intake space and wherein a pressure in the intake space is produced by a difference between an air flow produced by the cooling system and an air flow produced by the air movers.

3. The equipment enclosure of claim 1 wherein the enclosure contains electronic equipment with air movers that generate an air flow from the discharge space into the intake space and wherein a pressure in the discharge space is produced by a difference between an air flow produced by the cooling system and an air flow produced by the air movers.

4. The equipment enclosure of claim 1 wherein the first louver responds to a reversal in the pressure differential between the intake space and the ambient environment to connect the intake space to the ambient environment.

5. The equipment enclosure of claim 1 wherein the second louver responds to a reversal in the pressure differential between the discharge space and the ambient environment to connect the discharge space to the ambient environment.

6. The equipment enclosure of claim 1 wherein the first louver is biased in the absence of a pressure differential between the intake space and the ambient environment to separate the intake space from the ambient environment.

7. The equipment enclosure of claim 6 wherein the first louver is biased by gravity.

8. The equipment enclosure of claim 6 wherein the first louver is biased by a spring.

9. The equipment enclosure of claim 6 wherein the first louver is biased by a flexible hinge.

10. The equipment enclosure of claim 1 wherein the second louver is biased in the absence of a pressure differential between the discharge space and the ambient environment to separate the discharge space from the ambient environment.

11. The equipment enclosure of claim 10 wherein the second louver is biased by gravity.

12. The equipment enclosure of claim 10 wherein the second louver is biased by a spring.

13. The equipment enclosure of claim 10 wherein the second louver is biased by a flexible hinge.

14. The equipment enclosure of claim 1 further comprising a plurality of first louvers.

15. The equipment enclosure of claim 1 further comprising a plurality of second louvers.

16. An equipment enclosure that establishes an enclosed cooled environment separated from an ambient environment and has a cooling system that generates an air flow from an intake space in the enclosed environment to a discharge space in the enclosed environment, the enclosure housing electronic equipment with air movers that generate an air flow from the discharge space to the intake space, the enclosure comprising:
 a plurality of first louvers that respond to a pressure differential between the intake space and the ambient environment generated by a reduction in the air flow generated by the cooling system when the cooling systems fails to connect the intake space to the ambient environment; and
 a plurality of second louvers that respond to a pressure differential between the discharge space and the ambient environment generated by a reduction in the air flow generated by the cooling system when the cooling systems fails to connect the discharge space to the ambient environment.

17. The equipment enclosure of claim 16 wherein the cooling system comprises a heat exchanger element that reduces the air flow generated by the cooling system when the cooling system fails.

18. The equipment enclosure of claim 17 wherein the heat exchange elements connects the intake space to the discharge space.

19. A method of operating an equipment enclosure that establishes an enclosed environment separated from an ambient environment and has a cooling system that draws air from an intake space in the enclosed environment and discharges air into a discharge space in the enclosed environment, the method comprising:
 (a) providing a first louver that responds to a pressure differential between the intake space and the ambient environment to connect the intake space to the ambient environment when the cooling systems fails; and
 (b) providing a second louver that responds to a pressure differential between the discharge space and the ambient environment to connect the discharge space to the ambient environment when the cooling system fails.

20. The method of claim 19 wherein the enclosure contains electronic equipment with air movers that generate an air flow from the discharge space into the intake space and wherein a pressure in the intake space is produced by a difference between an air flow produced by the cooling system and an air flow produced by the air movers.

21. The method of claim 19 wherein the enclosure contains electronic equipment with air movers that generate an air flow from the discharge space into the intake space and wherein a pressure in the discharge space is produced by a difference between an air flow produced by the cooling system and an air flow produced by the air movers.

22. The method of claim 19 wherein the first louver responds to a reversal in the pressure differential between the intake space and the ambient environment to connect the intake space to the ambient environment.

23. The method of claim 19 wherein the second louver responds to a reversal in the pressure differential between the discharge space and the ambient environment to connect the discharge space to the ambient environment.

24. The method of claim 19 wherein the first louver is biased in the absence of a pressure differential between the intake space and the ambient environment to separate the intake space from the ambient environment.

25. The method of claim 19 wherein the second louver is biased in the absence of a pressure differential between the discharge space and the ambient environment to separate the discharge space from the ambient environment.

* * * * *